United States Patent
Manson et al.

(10) Patent No.: US 11,143,687 B2
(45) Date of Patent: Oct. 12, 2021

(54) DISCHARGE EVENT MONITORING DEVICE

(71) Applicant: Schweitzer Engineering Laboratories, Inc., Pullman, WA (US)

(72) Inventors: Scott M. Manson, Moscow, ID (US); Shankar V. Achanta, Pullman, WA (US); Gregory C. Zweigle, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 432 days.

(21) Appl. No.: 16/248,324

(22) Filed: Jan. 15, 2019

(65) Prior Publication Data
US 2020/0225274 A1    Jul. 16, 2020

(51) Int. Cl.
*H02H 7/00*      (2006.01)
*G01R 31/12*     (2020.01)
*H02H 7/26*      (2006.01)
*H02H 1/00*      (2006.01)
*G01R 31/14*     (2006.01)

(52) U.S. Cl.
CPC ..... *G01R 31/1272* (2013.01); *G01R 31/1209* (2013.01); *G01R 31/14* (2013.01); *H02H 1/0007* (2013.01); *H02H 1/0092* (2013.01); *H02H 7/26* (2013.01)

(58) Field of Classification Search
None
See application file for complete search history.

(56) References Cited

U.S. PATENT DOCUMENTS

| 4,635,055 | A | 1/1987 | Fernandes |
| 7,307,820 | B2* | 12/2007 | Henson ............ H02H 1/0015 324/536 |
| 8,738,318 | B2 | 5/2014 | Spillane |
| 9,372,172 | B2 | 6/2016 | Cheng |
| 9,383,394 | B2* | 7/2016 | Banting ........... G01R 19/2513 |
| 9,753,080 | B2 | 9/2017 | Andle |
| 10,073,132 | B2* | 9/2018 | Cern ................. G01R 31/12 |

FOREIGN PATENT DOCUMENTS

WO    2015087284    6/2015

OTHER PUBLICATIONS

Astrose® "Power Line Monitoring System for High Voltage and Extra High Voltage Power Lines" Fraunhofer-Institut für Zuverlässigkeit und Mikrointegration IZM, Oct. 2015.
(Continued)

*Primary Examiner* — Stephen W Jackson
(74) *Attorney, Agent, or Firm* — Bradley W. Schield (57) ABSTRACT

The present disclosure relates to systems and methods of detecting discharge events on power lines. For example, a system may include an acoustic sensor that detects a sound wave emitted from a power line. The system may include a radio frequency (RF) sensor that detects a radio wave emitted from the power line. The system may include electrical sensor circuitry that detects an electrical parameter of power being delivered on the power line. The system may include a processor that determines that a discharge event has occurred based on the sound wave, the radio wave, and the electrical characteristic. The system may provide an output signal indicating that the partial discharge event has occurred.

19 Claims, 4 Drawing Sheets

(56) References Cited

OTHER PUBLICATIONS

TLM® Conductor Monitor "Real Time Transmission Line Conductor Monitor" Lindsey Manufacturing Company, Mar. 2017.
AE-150™ "PD & Hot Spots Detection and Localization System for Power Transformers" NBD Technologies Inc., Feb. 2017.
Pabuna, Eduardo "Substation Surveillance Using Radio Frequency Interference (RFI) Measurements", Westco Electrical, Nov. 2014.
Guo, Geng, et al. "Energy Harvesting Devices for High Voltage Transmission Line Monitoring", 2011 IEEE Power and Energy Society General Meeting, Jul. 2011.
Janus, Patrick "Acoustic Emission Properties of Partial Discharges in the Time-Domain and their Applications" 2012.

\* cited by examiner

DISCHARGE EVENT MONITORING DEVICE

TECHNICAL FIELD

The present disclosure relates generally to power systems and, more particularly, to a device that monitors discharge events on power lines.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Power lines are commonly used to delivery power from a power generator to one or more loads. Such power lines may include one or more conductors to conduct energy between the power generator and the loads and are often installed on overhead structures or buried underground. For example, power lines may be suspended between two towers. The towers may include glass and/or ceramic insulators (e.g., bell insulators) from which the conductors may be suspended. Due to aging and/or various environmental conditions, discharge events may occur in which current is discharged from the power line to ground or another conductor. For instance, power may be discharged from the power line through to tower to the ground due to degradation of the insulators. These discharge events may cause power losses and/or may cause further break down of insulation on the power line.

Systems and methods described below may monitor a power line by utilizing a combination of sensors to detect discharge events. By combining sensor data from different types of sensors, discharge events may be more accurately determined than using data from a single sensor. For example, a monitoring system may include a radio frequency (RF) antenna that detects an electromagnetic wave generated by a discharge event on the power line and an acoustic sensor that detects a sound wave emitted by the discharge event on the power line. Further, the monitoring system may include electrical sensor circuitry that detects an electrical property of the power line. For example, the electrical sensor circuitry may include a current transformer to detect the current on the power line, a potential transformer to detect the voltage on the power line, or both. The monitoring system may include a processor, such as a microprocessor, operatively coupled to a memory. The processor may be programmed to determine an overall likelihood that a discharge event had occurred based on the sound wave, the radio wave, and the electrical property. The processor may then provide an indication, such as an alarm or notification, that the discharge event had occurred.

Figure 1:
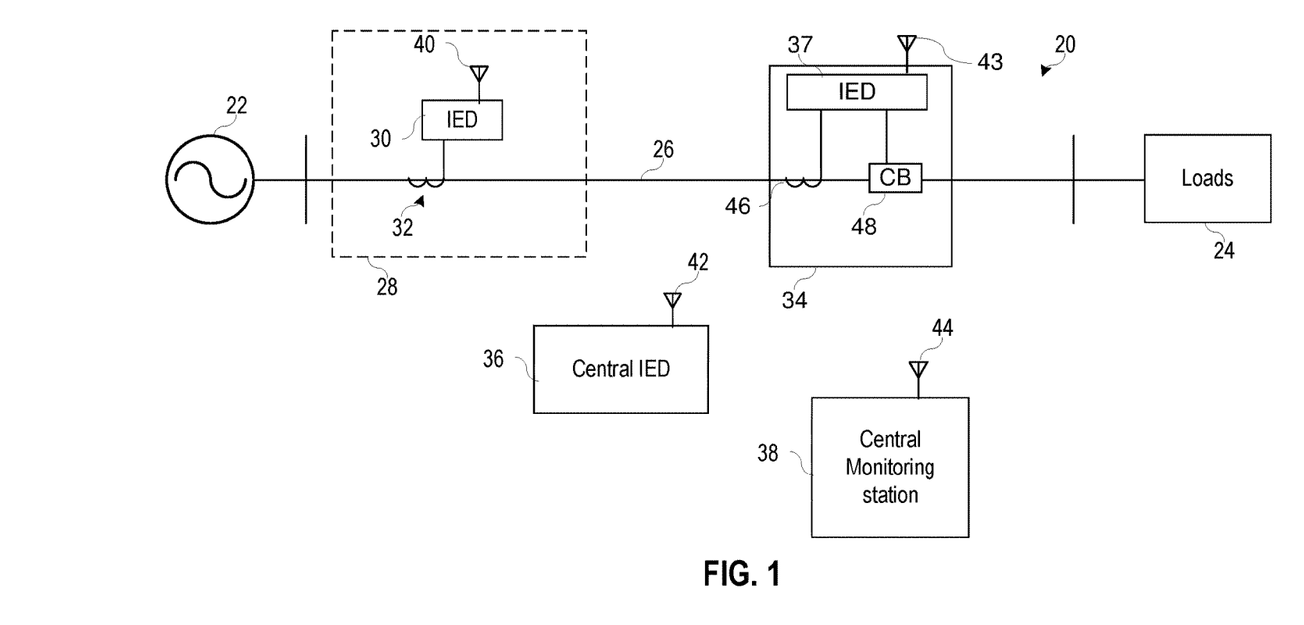
FIG. 1 is a one-line diagram of a power system that includes a power line with a monitoring system that detects discharge events, in accordance with an embodiment.

FIG. 1 illustrates a one-line diagram of a power delivery system 20 having a power generator 22 electrically coupled to one or more loads 24 via a power line 26. The power line 26 may include a monitoring system 28 having an electronic device, such as a line-mounted, line-powered (LMLP) intelligent electronic device (IED) 30. The IED 30 monitors the power line 26 via sensors 32 to detect various operating characteristics of the power line 26. In the illustrated embodiment, the monitoring system 28 the IED 30 may detect an overcurrent on the power line 26. Further, the monitoring system 28 may determine whether a discharge event has occurred based on the operating characteristics of the power line 26. The IED 30 may include a transceiver 40 that communicates with one or more other IEDs (e.g., central IED 36, substation IED 37 at a substation 34) and/or a central monitoring station 38 via the transceivers 42, 43, 44. The IED 30 may communicate data over a wide-area communications network of IEDs or may communicate directly with the other IED 36 and 37 and/or the central monitoring station 38. In the illustrated embodiment, the substation relay 37 may include a current transformer 46 and a circuit breaker 48 to monitor and control electrical characteristics of the power line 26. According to various embodiments, central monitoring system 38 may comprise one or more of a variety of types of systems. For example, central monitoring system 38 may include a supervisory control and data acquisition (SCADA) system and/or a wide area control and situational awareness (WACSA) system.

A communication network between the IED 30, the other IEDs 36 and 37, and the central monitoring station 38 may be facilitated by networking devices including, but not limited to, multiplexers, routers, hubs, gateways, firewalls, and switches. In some embodiments, IEDs and network devices may comprise physically distinct devices. In other embodiments, IEDs and network devices may be composite devices, or may be configured in a variety of ways to perform overlapping functions. IEDs and network devices may comprise multi-function hardware (e.g., processors, computer-readable storage media, communications interfaces, etc.) that can be utilized in order to perform a variety of tasks that pertain to network communications and/or to operation of equipment within system 20.

Figure 2:
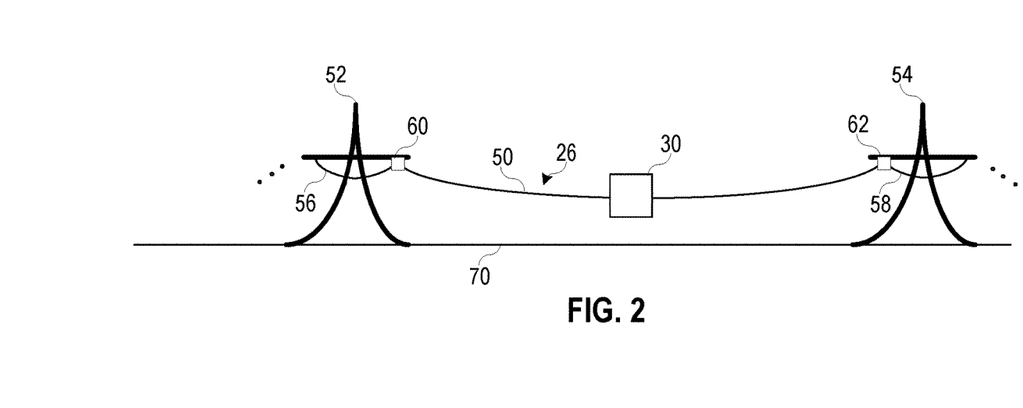
FIG. 2 is a side view of the power line of FIG. 1, in accordance with an embodiment.

FIG. 2 is a side view of a portion of the power line 26, in accordance with an embodiment. In the illustrated embodiment, a segment 50 of the power line 26 is suspended overhead between a first structure 52 and a second structure 54. The power line 26 may include jumpers 56 and 58 to electrically couple the segment 50 to one or more other segments of the power line 26. The segment 50 may be physically coupled to first structure 52 and the second structure via suspension insulators (e.g., bell insulators) 60 and 62. Although a single phase of the power line is shown in the illustrated embodiment, the monitoring system 28 may monitor, for example, each phase of a multi-phase power system (e.g., two phase, three phase, six phase, etc.).

Due to degradation and/or environmental factors, insulation of the power line 26, such as the suspension insulators 60 and 62, may break down, thus allowing for a discharge event to occur, such as partial discharge or corona discharge. These discharge events may cause power losses in which power does not reach the loads as desired. For example, current 72 during a partial discharge event may be discharged from power line 22, through the tower, to ground 70 due to degradation of the suspension insulators 60 and 62. Partial discharge events may also occur in which current is discharged to another phase of a three-phase power system. In other circumstances, current may be discharged due to ionization of the air surrounding the power line 26, referred to as corona discharge.

Conventional systems may attempt to detect these discharge events by detecting either sound waves or radio waves produced during such events. However, these detection methods may not be consistent because a similar sound wave or a similar radio wave may occur that is caused by a variety of events unrelated to partial discharge. As such, conventional systems may detect discharge events in an unreliable manner.

Systems and methods described herein may improve the reliability of discharge event detection by monitoring electrical characteristics of the power being delivered on the power line 26, such as the current and/or voltage. For example, discharge events may cause traveling waves in current on the power line 26 that may be detected by monitoring system. In some embodiments, the systems and methods described below may utilize the detected electrical characteristics of the power line 26 in conjunction with sound waves and radio waves to detect discharge events in a more reliable manner. For example, if a traveling wave indicative of a discharge event occurs at a similar time to a sound wave indicative of a discharge event and a radio wave indicative of a discharge event, then a discharge event may be reported more reliably than using the sound wave or the radio wave. Further, discharge events commonly begin to occur after a fault occurs. For example, the presence of a fault may cause the break down of the insulator. By detecting traveling waves and/or faults in conjunction with sound waves and radio waves, fewer false-positive discharge events may occur. As such, discharge event detection technology may be improved by including electrical sensor circuitry to monitor the electrical characteristics of power being delivered on the power line for traveling waves and/or occurrences of faults. Moreover, by monitoring the electrical characteristics in combination with sound waves and/or radio waves, a more reliable system and method may be used to detect discharge events.

Figure 3:
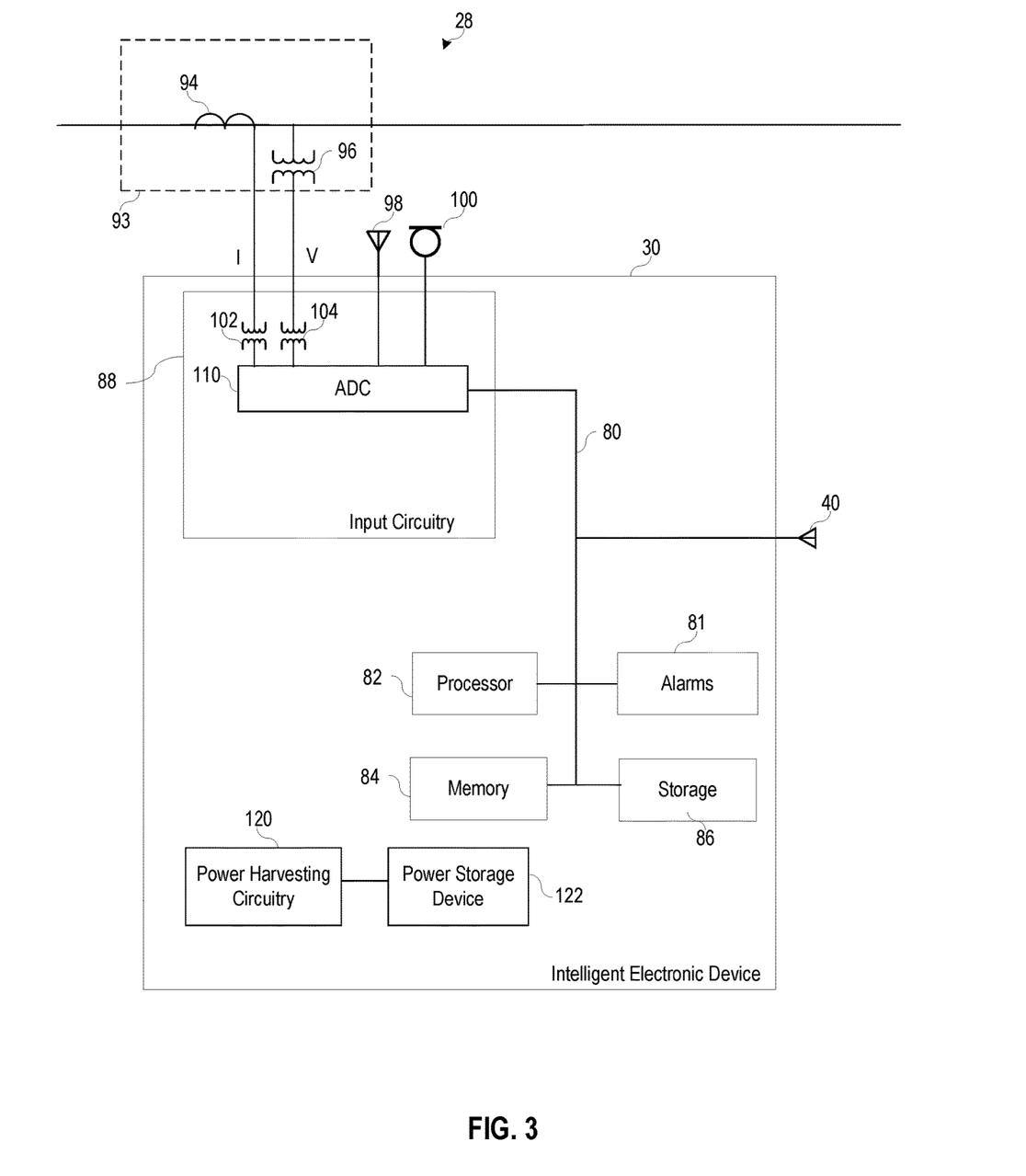
FIG. 3 is a block diagram of the monitoring system of FIG. 1, in accordance with an embodiment.

FIG. 3 is a block diagram of the monitoring system 28 that may be used to determine whether a discharge event has occurred. In the illustrated embodiment, the monitoring system 28 includes the IED 30 and sensor circuitry 93. As used herein, the IED 30 may refer to any microprocessor-based device that monitors, controls, automates, and/or protects monitored equipment within the electric power delivery system 20. Such devices may include, for example, remote terminal units, differential relays, distance relays, directional relays, feeder relays, overcurrent relays, programmable logic controllers (PLCs), programmable automation controllers, input and output modules, digital sample publishing units, merging units, and the like. The term IED may be used to describe an individual IED or a system comprising multiple IEDs.

In the illustrated embodiment, the IED 30 includes a bus 80 operably coupling a processor 82 or processing unit(s) to a memory 84, a computer-readable storage medium 86 and input circuitry 88. The processor 82 may be configured to process inputs received via the input circuitry 88. The processor 82 may operate using any number of processing rates and architectures. The processor 82 may be configured to perform various algorithms and calculations described herein using computer executable instructions stored on computer-readable storage medium 86. The processor 82 may be embodied as a microprocessor, a general purpose integrated circuit, an application-specific integrated circuit (ASIC), a field programmable gate array (FPGA), and/or other programmable logic devices. In an embodiment described below, the processor 82 may be a digital signal processor (DSP). The DSP may include a variety of hardened circuitry with hardened logic as well as software and/or firmware for performing the steps described herein. Furthermore, the processor 82 may be a single contained processing module or may be incorporated wholly or partially within any of the other elements within the IED 30.

While the IED 30 is used to perform the processing described herein, some or all of the processes described herein may be performed at the one or more other IEDs (e.g., the central IED 36 and/or the substation IED 37) and/or the central monitoring station 38. For example, the IED 30 may communicate the data (e.g., electrical data, radio data, audio data, etc.) to the substation IED 37 to cause the substation IED 37 to perform the processes described herein and to control operation of the circuitry breaker 48 based on the processes. For instance, if the substation IED 37 determines that a discharge event has occurred based on measurements from the IED 30, the substation IED 37 may electrically disconnect loads 24 via the circuit breaker 48.

The input circuitry 88 receives electrical signal(s) from electrical sensor circuitry 93, such as a current sensor (e.g., current transformer) and/or voltage sensor (e.g., voltage transformer), that detects one or more electrical characteristics of the power being delivered on the power line 26. For example, the input circuitry 88 may receive a current signal and/or a voltage signal from the current transformer 94 and/or the voltage transformer 96, respectively. Further, the input circuitry 88 may receive a radio frequency (RF) signal from an RF antenna 98 and an audio signal from an acoustic sensor 100. The RF antenna 98 may be any suitable antenna to detect radio wave(s) emitted from the power line 26 by a discharge event. The RF antenna 98 may convert energy from the radio wave into a radio signal to allow the IED 30 to monitor the radio waves received by the RF antenna 98 that are emitted by the power line 26 due to discharge events. Similarly, the acoustic sensor 100 may be any suitable sensor that detects sound wave(s), such as a microphone, a pressure transducer, or the like. The acoustic sensor 100 may convert energy from the sound waves into an audio signal to monitor the sound waves received by the acoustic sensor 100 that are emitted by the power line 26 due to discharge events.

The input circuitry 88 may include potential transformers 102 and 104 that transform the current signal and the voltage signal, respectively, to a level that may be sampled. A/D converter(s) 110 may sample each of the signals from the potential transformers 102 and 104, the antenna 98, and the acoustic sensor 100. The A/D converter(s) may produce digitized analog signals representative of measured current, measured voltage, measured RF signal, and the measured audio signal. Similar values may also be received from other distributed controllers, station controllers, regional controllers, or centralized controllers. The values may be in a digital format or other format. In certain embodiments, the input circuitry 88 may be utilized to monitor current signals associated with a portion of an electric power delivery system.

The A/D converter(s) 110 may be connected to the processor 82 by way of the bus 80, through which digitized representations of current and voltage signals may be transmitted to the processor 82. As described above, the processor 82 may be used to monitor and protect portions of the electric power delivery system 20, and issue control instructions in response to the same (e.g., instructions implementing protective actions).

The processor 82 may receive the digital signals from the A/D converter(s) 110 representative of the current signal from the current transformer 94, the voltage signal from the voltage transformer 96, the radio signal from the antenna 98, and the audio signal from the acoustic sensor 100. The processor 82 may determine whether a discharge event has occurred based on the digital representations of each of the current signal, the voltage signal the radio signal, and the audio signal.

The processor 82 may send a signal indicating that the discharge event has occurred via communication circuitry of the IED 30, such as the transceiver 40. For example, the processor 82 may send the output signal to the other IED 36 and/or the central monitoring station 38 to allow the central monitoring station 38 to display the occurrence of the discharge event on a display at the central monitoring station 38. This may allow an operator to further inspect the power line 26 having the discharge event at the location of the IED 30. While two antennas 40 and 98 are shown, this is meant to be illustrative and, in some embodiments, the same antenna may be used for communication as well as monitoring the power line 26 for radio waves generated from EMF waves to discharge events.

In the electronic device 10 of FIG. 1, the processor(s) 82 may be operably coupled with the memory 84 and the nonvolatile storage 86 to perform various portions of the systems and methods described herein. Such programs or instructions executed by the processor(s) 82 may be stored in any suitable article of manufacture that includes one or more tangible, computer-readable media at least collectively storing the instructions, routines, and/or processes, such as the memory 84 and the nonvolatile storage 86. The memory 84 and the nonvolatile storage 86 may include or interface with any suitable articles of manufacture (e.g., software, hardware, or firmware) for storing data and executable instructions, such as random-access memory, read-only memory, rewritable flash memory, hard drives, and optical discs. In addition, programs encoded on such an electronic device may also include instructions that may be executed by the processor 82 to enable the IED 30 to provide various functionalities. In some embodiments, the computer-readable storage medium 86 and the modules therein may all be implemented as hardware components, such as via discrete electrical components, via an FPGA, and/or via an ASIC.

In some embodiments, the IED 30 may include one or more alarms 81, such as light emitting diodes (LEDs), displays, audible sounds, or the like, to notify an operator of discharge events. The processor 82 may send a signal to control operation of the alarm to provide an indication that a discharge event has occurred on the power line 26.

The monitoring system 28 may be a line-mounted, line-powered (LMLP) device on the power line 26. In such embodiments, the IED 30 may include power harvesting circuitry 120 that harvests energy from the power line 26 to power the various operations of IED 30. For example, the power harvesting circuitry 120 may include the current transformer 94 or another current transformer inductively coupled to the power line 26 to receive power from the power line 26. Further, the power harvesting circuitry 120 may provide the power to a power storage device 122, such as a battery, to store the power received to enable the IED 30 to operate without power from the power line 26.

Figure 4:
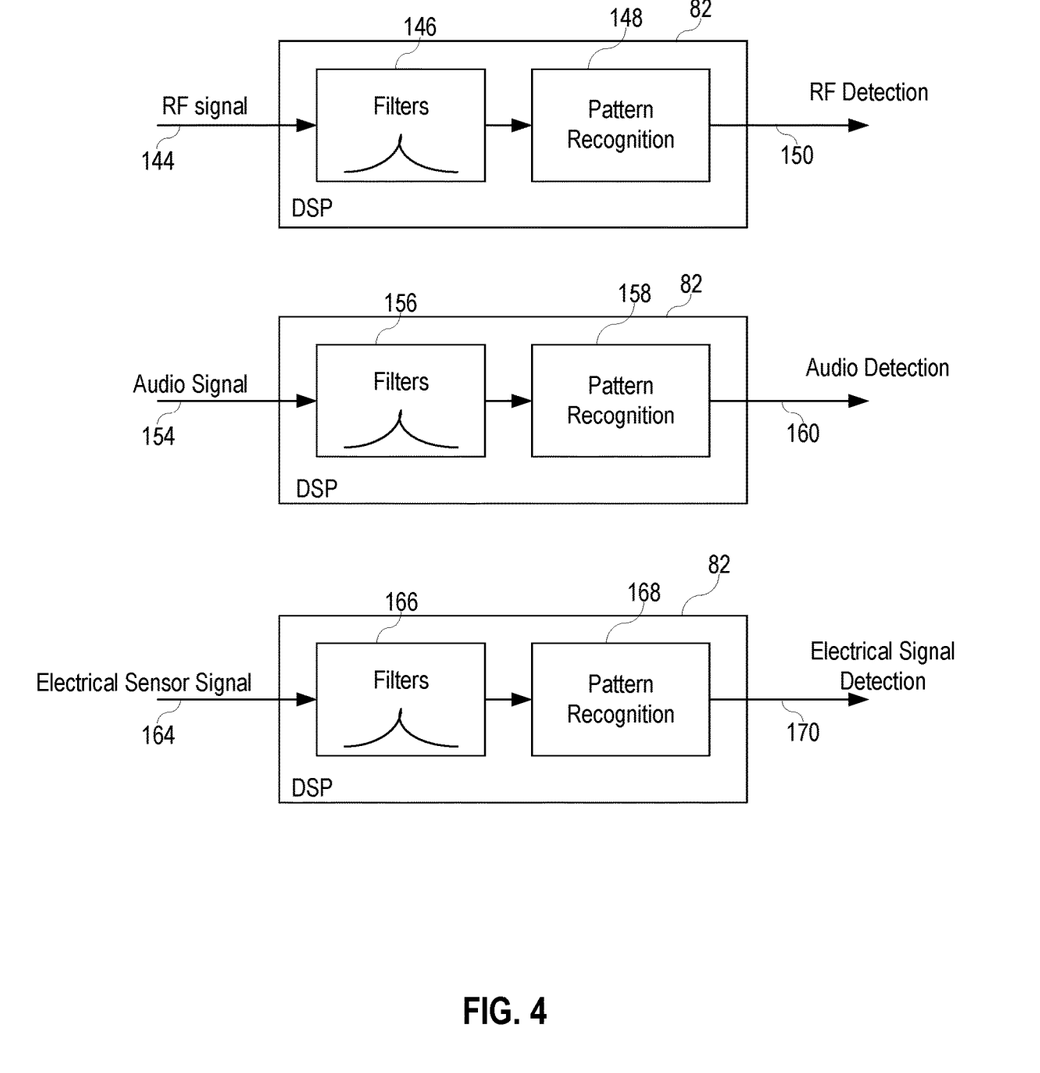
FIG. 4 is a data flow diagram of data received and processed by the monitoring system of FIG. 1, in accordance with an embodiment.

FIG. 4 is a data flow diagram illustrative of a process performed by the processor 82 and other related items of FIG. 3. Note that, in the example described below, the process is performed using a digital signal processor (DSP) as the processor 82, however, any suitable processor 82 may be used to perform the steps described herein. Moreover, while the illustrated embodiment described below is performed at the IED 30 on the power line 26, in other embodiments, some or all of the processing of the sensor signals may be performed on a processor at the central monitoring station 38.

The processor 82 may receive the digitized representation of the RF signal 144 indicative of the radio wave detected by the RF antenna 98. The processor 82 may filter 146 the RF signal 144 to remove noise in the RF signal 144 and compare the filtered RF signal to an RF pattern 148 associated with a discharge event. For example, electromagnetic field (EMF) waves may be emitted from the power line 26 due to changes in current caused by the discharge event. These EMF waves may have recognizable characteristics as compared to other EMF waves caused by the power line 26.

The RF pattern 148 may be a reference signal that is based on prior occurrences of discharge events. For instance, discharge events may generally cause transient currents on the power line 26 that produce EMF waves in the surrounding air of the power line 26 at a frequency that may be detected by the RF antenna 92 and received in the RF signal 144. The processor 82 may compare the RF signal 144 to the RF pattern 148 using any suitable method, such as fast fourier transform (FFT) analysis, cross correlation analysis, or the like, to determine a likelihood 150 that the radio wave indicates that a discharge event has occurred. The likelihood 150 may be based on an amount in which the RF signal 144 matches the RF pattern.

Similarly, the processor 82 may receive the digitized representation of the audio signal 154 indicative of the sound wave detected by the acoustic sensor 100. The processor 82 may filter 156 the audio signal 154 to remove noise in the audio signal 156. The processor 82 may then compare the filtered audio signal 154 to an audio pattern 158 associated with partial discharge. For example, an audible noise, such as a snapping sound, may be emitted from the power line 26 due to insulator tracking (i.e., break down) caused by the discharge event. The audio pattern 158 may be a reference signal that is based on audio signals of prior occurrences of discharge events. For example, the reference pattern may be an audio signal of an example of the snapping sound. The processor 82 may compare the audio signal 154 to the audio pattern 158 using any suitable method, such as FFT analysis, cross correlation analysis, or the like, to determine a likelihood 160 that the sound wave indicates that a discharge event occurred. For instance, the processor 82 may determine the likelihood 160 based on filtered frequencies of the audio signal compared to frequencies in the reference pattern of the snapping sound caused by discharge events. That is, the likelihood 160 may be based on an amount in which the audio signal 154 matches the audio pattern 158.

Further, the processor 82 may receive the digitized representation of the electrical sensor signal 164 indicative of the electrical characteristic detected by the electrical sensor circuitry, such as the current signal from the current transformer 94 and/or the voltage signal from the voltage transformer 96, and filter 166 the electrical sensor signal 164 to remove noise in the electrical sensor signal 164. The processor 82 may then compare the filtered electrical sensor signal 164 to an electrical pattern associated with discharge events. For example, the processor 82 may compare the filtered electrical sensor signal 164 to a traveling wave pattern 168. A traveling wave may refer to transient characteristics in the electrical signal caused by the discharge event on the power line 26. For example, the traveling wave may include transient characteristics in the electrical sensor signal 164 at a different frequency (e.g., 100 Hz, 1 kHz, 10 kHz, 100 kHz, 1 MHz, etc.) than the delivered current and/or voltage (e.g., 50 Hz, 60 Hz, etc.) due to the discharge event. That is, traveling waves may occur following discharge events on the power line 26. Due to the correlation between traveling waves and discharge events, the processor 82 may determine that there is a higher likelihood of a discharge event when the electrical signal includes such transient characteristics of traveling waves. The processor 82 may compare the electrical sensor signal 164 to the traveling wave pattern 168 based on any suitable method, such as FFT analysis, cross correlation analysis, or the like, to determine a likelihood 170 that the electrical sensor signal indicates that a discharge event occurred. For example, a band-pass filter may filter the signal around the fundamental frequency and compare the filtered signal to the traveling wave pattern. The likelihood 170 may be based on an amount in which the electrical signal matches the traveling wave pattern 168. While traveling waves are used as an example herein, any other suitable electrical pattern may be used, such as overcurrent patterns, undercurrent patterns, overvoltage patterns, or undervoltage patterns. Upon determining each of the individual likelihoods that each of the radio wave, the sound wave, and the electrical sensor signal indicate an occurrence of a discharge event, the processor 82 may determine an overall likelihood that a discharge event has occurred based on a combination of each of the individual likelihoods.

Note that the pattern recognition process may account for various timing differences in the signals. For example, the traveling wave may be detected prior to the audio signal as traveling waves may travel faster than the audio signal. In some embodiments, the likelihoods 150, 160, and 170 may be averaged over time to account for these time differences. In other embodiments, a greatest likelihood for each of the likelihoods 150, 160, and 170 over a period of time may be used as the likelihood for that respective signal.

In some embodiments, the pattern recognition engine of the IED that includes the RF pattern 148, the audio pattern 158, and the electrical pattern 168 may be continuously trained using machine learning by feeding historical events into the pattern recognition engine. For example, events that occur during operation of the IED may be used to adjust the pattern recognition engine to more reliably detect future patterns. Further, the monitoring station may periodically upload the pattern recognition updates in to the IED based on the past successful hits as well as other environmental conditions.

Figure 5:
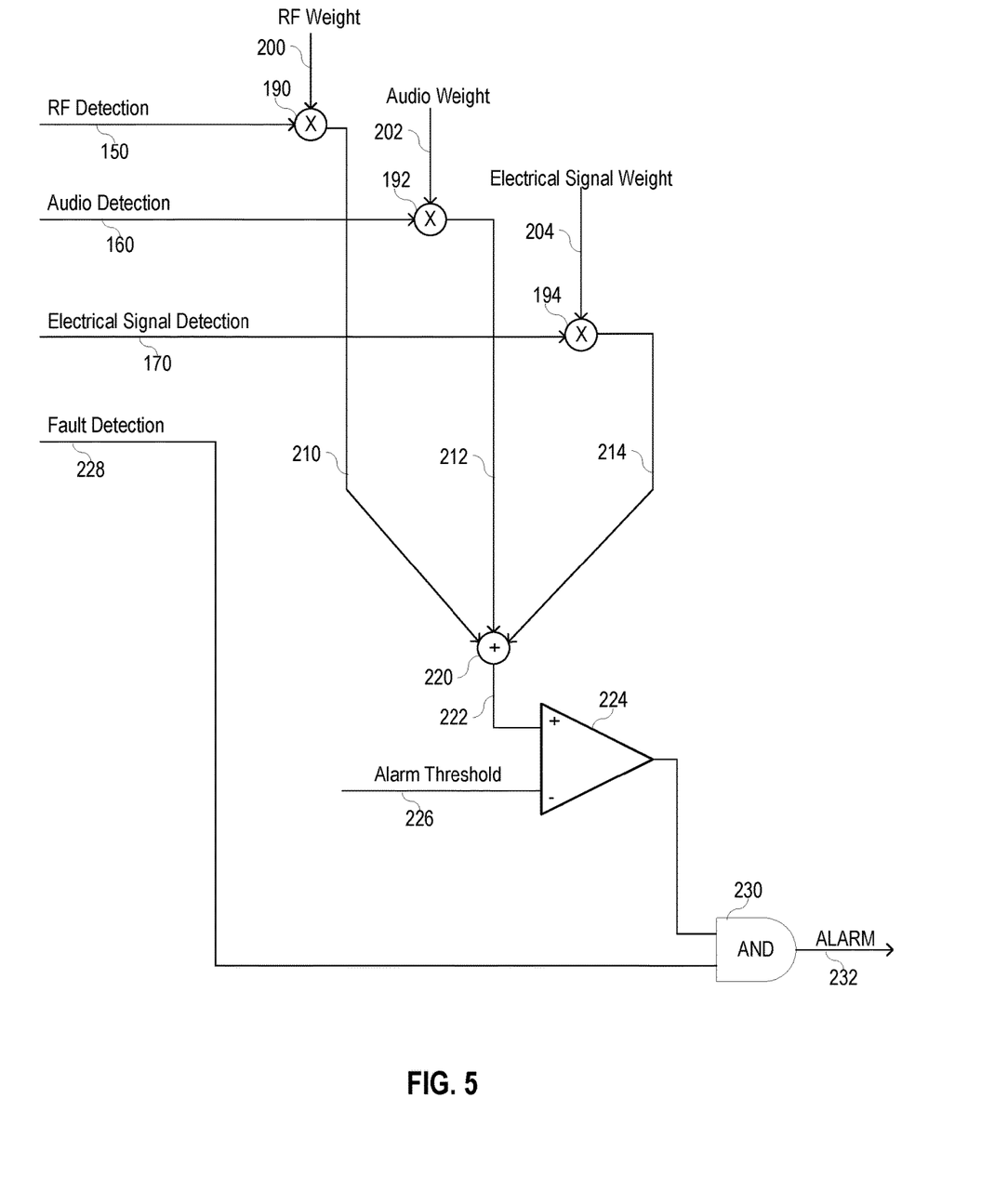
FIG. 5 is a logic diagram of a process performed by the monitoring system of FIG. 1, in accordance with an embodiment.

FIG. 5 is a logic diagram that may be implemented to perform the methods described herein. In particular, the processor 82 may weight, at multiplier 190, the likelihood 150 that the radio wave indicates that a discharge event occurred with an RF weight 200 to determine a weighted radio wave likelihood 210. The processor 82 may weight, at multiplier 192, the likelihood 160 that the sound wave indicates that a discharge event occurred with a sound weight 202 to determine a weighted sound wave likelihood 212. Further, the processor 82 may weight, at multiplier 194, the likelihood 170 that the electrical signal indicates that a discharge event occurred with an electrical signal weight 204 to determine a weighted electrical signal likelihood 214. Each of the weighted likelihoods 210, 212, and 214 may be summed at summation 220 to determine an overall likelihood 222 that a discharge event has occurred. Each of the weights 200, 202, and 204 may be based on the amount of confidence that the given signal provides towards the overall likelihood that a discharge event has occurred. For example, if it is determined that there is a stronger correlation between traveling waves and partial discharge events than sound waves and partial discharge events, then such an application may place a heavier weight on the electrical signal weight 204 than the audio signal weight 202.

The processor 82 may compare, at comparator 224, the overall likelihood 222 that the discharge event has occurred to an alarm threshold 226. If the overall likelihood 222 that a discharge event has occurred exceeds the alarm threshold 226 and a fault 228 was detected on the power line 26, at AND gate 230, the processor 82 may provide an output signal (alarm 232) indicating that a discharge event has occurred. In the illustrated embodiment, the fault is detected via the sensor circuitry 93. In other embodiments, the fault may be detected at another IED and communicated via the transceiver 40. That is, the processor 82 may send the output signal to the one or more alarms 81 and/or to the transceiver to provide an indication that a discharge event has occurred.

Discharge events may begin to occur after a fault occurs on the power line 26. For example, increased current due to a fault may cause the insulation of the power line 26 to break down (e.g., tracking). The break down of the power line insulation may cause a low impedance path to ground which enables discharge of current to the ground. The processor 82 may utilize the electrical characteristic monitored by the processor 82 to determine that a fault has occurred on the power line 26. For example, the processor 82 may compare the electrical signal representative of current on the power line 26 to a current threshold. If the current threshold is exceeded, the processor 82 may determine that a fault occurred on the power line 26.

The IED 30 may send the output signal, via the transceiver 40, to one or more other IEDs 36 and/or to a central monitoring station 38 to allow the central monitoring station 38 to notify an operator of the discharge event. For example, the central monitoring station 38 may display the notification of the discharge event on a display at the central monitoring station 38. In other embodiments, the IED 30 may send the output signal to control an alarm, such as a light emitting diode (LED), a display, an audible alarm, or a visual alarm, on the IED 30. In some embodiments, the IED 30 may transmit the output signal, via the transceiver 40, to a relay to cause the relay to open a circuit breaker of the power delivery system 20 to prevent further discharge events.

In some embodiments, the IED 30 may learn to better recognize discharged events as feedback is received. For example, the processor 82 may receive, via the transceiver, updated patterns based on feedback received regarding whether the discharge event is confirmed. The updated patterns may then be used to better detect discharge events. In certain embodiments, additional layers of weights and/or metrics may be included to form a network of weights to determine whether a discharge event has occurred.

Note that any suitable processor 82 may be used in various embodiments. As mentioned above, some embodiments may utilize DSP circuitry to perform one or more of the processes described herein. In some embodiments, such DSP circuitry may utilize the multiply-accumulate (MAC) circuitry (e.g., hardened logic) on the DSP circuitry to perform the multiplications and accumulation to determine the overall likelihood 222 that a discharge event has occurred.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . ." or "step for [perform]ing [a function] . . .", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device, comprising:
   an acoustic sensor configured to detect a sound wave emitted from a power line;
   a radio frequency (RF) sensor configured to detect a radio wave emitted from the power line;
   a memory;
   a processor operatively coupled to the memory, wherein the processor is configured to execute instructions stored on the memory to cause the processor to:
      receive an electrical signal indicative of an electrical characteristic of a power line;
      receive a sound signal indicative of a sound wave detected by an acoustic sensor of the electronic device;
      receive an RF signal indicative of the radio wave detected by the RF sensor of the electronic device;
      determine that a discharge event has occurred based at least in part on the sound wave, the radio wave, and the electrical characteristic; and
      provide an output signal indicating that the discharge event has occurred.

2. The electronic device of claim 1, wherein the processor is configured to provide the output signal indicating that the discharge event has occurred when a fault is detected on the power line.

3. The electronic device of claim 2, wherein the processor is configured to detect the fault based on the electrical characteristic of the power being delivered on the power line.

4. The electronic device of claim 1, comprising electrical sensor circuitry having a current transformer configured to be operatively coupled to the power line to detect current on the power line as the electrical characteristic.

5. The electronic device of claim 1, wherein the processor is configured to receive the electrical signal from another electronic device via communication circuitry.

6. The electronic device of claim 1, comprising receiving a pattern recognition update to adjust the determination of whether the discharge event has occurred based on other successful determinations.

7. The electronic device of claim 1, wherein the processor is configured to provide the output signal, via a transceiver, to a central monitoring station to be displayed on a display at the central monitoring station.

8. The electronic device of claim 1, wherein the processor is configured to execute instructions stored on the memory to cause the processor to:
   compare the sound signal to a sound wave pattern to determine a likelihood that the sound signal indicates that the discharge event occurred;
   compare the RF signal to a radio wave pattern to determine a likelihood that the RF signal indicates that the discharge event occurred;
   compare the electrical signal to a traveling wave pattern to determine a likelihood that the electrical signal indicates that the discharge event occurred;
   weigh the likelihood that the sound signal indicates that the discharge event occurred with a sound weight to determine a weighted sound likelihood, weigh the likelihood that the RF signal indicates that the discharge event occurred with an RF weight to determine a weighted radio wave likelihood, and weigh the likelihood that the electrical signal indicates that the discharge event occurred with an electrical signal weight to determine a weighted electrical signal likelihood;
   sum the weighted sound likelihood, the weighted radio wave likelihood, and the weighted electrical signal likelihood, to determine an overall likelihood that the discharge event has occurred;
   compare the overall likelihood that the discharge event has occurred to a threshold; and
   determine that the discharge event has occurred when the threshold is exceeded by the overall likelihood of the discharge event.

9. The electronic device of claim 1, comprising input circuitry configured to:
   provide the sound signal to the processor as a digital representation of the sound wave; and
   provide the RF signal to the processor as a digital representation of the radio wave.

10. The electronic device of claim 1, wherein the processor is configured to transmit the output signal, via a transceiver of the electronic device, to a relay to cause the relay to open a circuit breaker to disconnect the power line to prevent further discharge events from occurring.

11. A non-transitory computer readable medium comprising instructions for detecting a discharge event, that when executed by a processor, cause the processor to perform operations comprising:
   receiving an electrical signal indicative of an electrical characteristic of power being delivered on a power line;
   comparing the electrical signal to a traveling wave pattern to determine a likelihood that the electrical signal indicates that the discharge event has occurred; and
   providing an output signal indicating that the discharge event has occurred based upon the likelihood.

12. The non-transitory, computer readable medium of claim 11, wherein the traveling wave pattern comprises transient characteristics in the electrical signal different than normal electrical characteristics of power being delivered on the power line during normal operation.

13. The non-transitory, computer readable medium of claim 12, wherein the transient characteristics comprise a current on the power line at a different frequency or magnitude than the frequency or magnitude of power being delivered on the power line during normal operation.

14. A non-transitory, computer readable medium comprising instructions for detecting a discharge event, that when executed by the processor, cause the processor to perform operations comprising:
   training pattern recognition of a discharge event, using machine learning, based on historical events;
   receiving an electrical signal indicative of an electrical characteristic of power being delivered on a power line;
   determining that the discharge event has occurred based at least in part on the electrical signal; and
   providing an output signal indicating that the discharge event has occurred.

15. A method, comprising:
   receiving a sound signal indicative of a sound wave caused by a power line;
   receiving a radio frequency (RF) signal indicative of a radio wave caused by the power line;
   receiving an electrical signal indicative of an electrical characteristic of power being delivered on the power line;
   comparing the sound signal to a sound wave pattern to determine a likelihood that the sound signal indicates that a discharge event occurred on the power line;
   comparing the RF signal to a radio wave pattern to determine a likelihood that the RF signal indicates that the discharge event occurred;
   comparing the electrical signal to a traveling wave pattern to determine a likelihood that the electrical signal indicates that the discharge event occurred;
   weighting the likelihood that the sound signal indicates that the discharge event occurred with a sound weight, weighting the likelihood that the RF signal indicates that the discharge event occurred with an RF weight, and weighting the likelihood that the electrical signal indicates that the discharge event occurred with an electrical signal weight;
   summing the sound factor, the radio factor, and the traveling wave factor to determine an overall likelihood that the discharge event has occurred;
   comparing the overall likelihood that the discharge event has occurred to a threshold; and
   determining that the discharge event has occurred when the threshold is exceeded by the overall likelihood of the discharge event; and
   providing an output signal indicating that the discharge event has occurred.

16. The method of claim 15, wherein the sound weight, the RF weight, and the electrical signal weight are based on an amount of confidence that the sound signal, the RF signal, and the electrical signal respectively provide determining that the discharge event has occurred.

17. The method of claim 15, comprising filtering the electrical signal to reduce noise in the electrical signal prior to comparing the electrical signal to the traveling wave pattern.

18. The method of claim 15, comprising receiving power from the power line to power operation of an electronic device coupled to the power line.

19. The method of claim 15, comprising transmitting the output signal, via a transceiver, to a relay to cause the relay to open a circuit breaker disconnect the power line to prevent further discharge events from occurring.

* * * * *